US012646657B2

(12) United States Patent
Nithyanandhan et al.

(10) Patent No.: US 12,646,657 B2
(45) Date of Patent: Jun. 2, 2026

(54) UNSYMMETRICAL SQUARAINE DYES AND APPLICATIONS THEREOF

(71) Applicant: Council of Scientific and Industrial Research, New Delhi (IN)

(72) Inventors: Jayaraj Nithyanandhan, Pune (IN); Ambarish Kumar Singh, Pune (IN); Amrita Singh, Pune (IN)

(73) Assignee: Council of Scientific and Industrial Research, Delhi (IN)

( * ) Notice: Subject to any disclaimer, the term of this patent is extended or adjusted under 35 U.S.C. 154(b) by 1103 days.

(21) Appl. No.: 17/697,511

(22) Filed: Mar. 17, 2022

(65) Prior Publication Data

US 2022/0227999 A1 Jul. 21, 2022

Related U.S. Application Data

(63) Continuation-in-part of application No. 16/320,177, filed as application No. PCT/IN2017/050313 on Jul. 28, 2017, now Pat. No. 11,377,562.

(30) Foreign Application Priority Data

Jul. 28, 2016 (IN) ............................ 201611025821

(51) Int. Cl.
*H01G 9/20* (2006.01)
*C09B 57/00* (2006.01)
*H10K 85/60* (2023.01)

(52) U.S. Cl.
CPC ......... *H01G 9/2059* (2013.01); *C09B 57/007* (2013.01); *H10K 85/652* (2023.02)

(58) Field of Classification Search
CPC . H01G 9/20259; H10K 85/652; C09B 57/007
USPC ........................................................... 549/43
See application file for complete search history.

(56) References Cited

U.S. PATENT DOCUMENTS

| | | | | |
|---|---|---|---|---|
| 8,637,680 | B2 | 1/2014 | Hayase et al. | |
| 11,377,562 | B2 | 7/2022 | Nithyanandhan et al. | |
| 2003/0082329 | A1 * | 5/2003 | Shimizu ................. | G11B 7/249 428/64.4 |
| 2010/0300521 | A1 | 12/2010 | Fuhrmann et al. | |
| 2019/0270889 | A1 | 9/2019 | Nithyanandan | |

FOREIGN PATENT DOCUMENTS

| | | | |
|---|---|---|---|
| EP | 0973181 | | 1/2000 |
| JP | 2001036110 | | 2/2001 |
| JP | 2005319728 A | * | 11/2005 |
| JP | 2011165963 | | 8/2011 |
| WO | WO 2009053107 | | 4/2009 |

OTHER PUBLICATIONS

Morimoto et al.., "Design of Far-Red Sensitizing Squaraine Dyes Aiming Towards the Fine Tuning of Dye Molecular Structure," Journal of Nanoscience and Nanotechnology, Apr. 2016,16:3282-3288. (Year: 2016).*

Qin et al., "Squaraine Dyes for Dye-Sensitized SolarCells:RecentAdvancesandFutureChallenges", Chemistry—AnAsianJournal, Apr. 2013,8(8):1706-1719 (Year: 2013).*

Alagumalai et al., "Effect of Out-of-Plane Alkyl Groups Position in Dye-Sensitized Solar Cell Efficiency: A Structure-Property Relationship Utilizing Indoline-Based Unsymmetrical Squaraine Dyes", ACS Applied Materials & Interfaces, Dec. 2016, 8(51):35353-35367.

Bisht et al., "Panchromatic Sensitizer for Dye-Sensitized Solar Cells: Unsymmetrical Squaraine Dyes Incorporating Benzodithiophene [pi]-Spacer with Alkyl Chains to Extend Conjugation, Control the Dye Assembly on Ti0 2, and Retard Charge Recombination", The Journal of Organic Chemistry, Feb. 2017, 82(4):1920-1930.

International Preliminary Report on Patentability in International Appln. No. PCT/IN2017/050313, dated Feb. 7, 2019, 10 pages.

International Search Report and Written Opinion in International Appln. No. PCT/IN2017/050313, dated Oct. 24, 2017, 14 pages.

Magistris et al., "Near-Infrared Absorbing Squaraine Dye with Extended Pi Conjugation for Due-Sensitized Solar Cells," Renewable Energy, 2013, 60:672-678.

Morimoto et al., "Design of Far-Red Sensitizing Squaraine Dyes Aiming Towards the Fine Tuning of Dye Molecular Structure," Journal of Nanoscience and Nanotechnology, Apr. 2016, 16:3282-3288.

Qin et al., "Squaraine Dyes for Dye-Sensitized Solar Cells: Recent Advances and Future Challenges", Chemistry—An Asian Journal, Apr. 2013, 8(8):1706-1719.

Singh et al., "D-A-D Based Complementary Unsymmetrical Squaraine Dyes for Co-sensitized Solar Cells: Enhanced Photocurrent Generation and Suppressed Charge Recombination Processes by Controlled Aggregation," Applied Energy Materials, Mar. 17, 2021, 4:3182-3193.

Takuya et al., "Design of Far-Red Sensitizing Squaraine Dyes Aiming Towards the Fine Tuning of Dye Molecular Structure", Journal of Nanoscience and Nanotechnology, Apr. 2016, 16(4):3282-3288.

* cited by examiner

*Primary Examiner* — Joseph S Del Sole
*Assistant Examiner* — Ronald Grinsted
(74) *Attorney, Agent, or Firm* — Fish & Richardson P.C.

(57) ABSTRACT

The present invention relates to an unsymmetrical squaraine dye of formula (I) and process for the preparation thereof. The process includes dissolving a 3-cycloalkene-1,2-dione compound in acetone and aqueous HCl to afford a semi-squaraine compound. The process includes refluxing the semisquaraine compound and phenyl carboxylic acid dissolved in solvent to afford the unsymmetrical squaraine dye. Further, the present invention relates to an electronic device with an enhanced device efficiency containing a dye of formula (I) co-sensitized with a squaraine dye.

15 Claims, 5 Drawing Sheets

UNSYMMETRICAL SQUARAINE DYES AND APPLICATIONS THEREOF

CROSS-REFERENCE TO RELATED APPLICATIONS

This application is a continuation in part of U.S. application Ser. No. 16/320,177, filed Jan. 24, 2019, which is U.S. national phase filing under 35 U.S.C. § 371 of International Application No. PCT/IN2017/050313, filed Jul. 28, 2017, which claims priority to Indian Application No. 201611025821, filed Jul. 28, 2016. The entire contents of the prior application are incorporated herein by reference in their entirety.

FIELD OF THE INVENTION

The present invention relates to unsymmetrical squaraine dyes. More particularly, the present invention relates to an unsymmetrical squaraine dye of formula (I) and process for the preparation thereof. Further, the present invention relates to an electronic device comprising an unsymmetrical squaraine dye of formula (I).

(I)

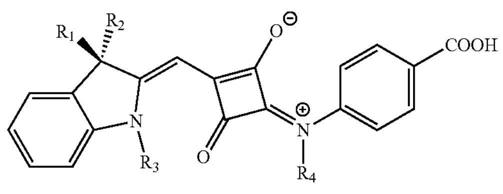

An unsymmetrical squaraine dye of formula (I) is useful for dye-sensitized solar cells (DSSCs).

BACKGROUND OF THE INVENTION

Squaraine, a D-A-D type dye belongs to polymethine dyes; possess a sharp absorption with high extinction coefficient in the far-red to NIR regions. Besides this electronic property, these dyes self-assemble in solution as well as in solid state to have H- and J-aggregates due to the strong dye-dye interactions. Such assembled structures have been utilized in the sensor, xerography and organic solar cells. In DSSC, such facile formation of aggregate on the $TiO_2$ surface plays a detrimental factor for the device performance.

Article titled, "Effect of out-of-plane alkyl group's position in dye sensitized solar cell efficiency: A structure-property relationship utilizing indoline based unsymmetrical squaraine dyes" by Alagumalai et. al. published in *ACS Appl. Mater. Interfaces* 2016, 8, 35353-35367, also refer US patent application no. 2019/0270889 reports synthesis of series of indoline based unsymmetrical squaraine (SQ) dyes that contain alkyl chains at sp3 C- and N-atoms of indoline moieties with a carboxylic acid anchoring group. The optical and electrochemical properties of the SQ dyes in solution were nearly identical as there was no change in the D-A-D SQ framework, however, remarkable changes with A series of indoline based unsymmetrical squaraine (SQ) dyes that contain alkyl chains at sp3 C- and N-atoms of indoline moieties with a carboxylic acid anchoring group were synthesized. The optical and electrochemical properties of the SQ dyes in solution were nearly identical as there was no change in the D-A-D SQ framework, however, remarkable changes with respect to the power conversion efficiencies (PCE) were observed depending upon the position of alkyl groups in the dye.

The effect of extending the conjugation leads to 105 nm shift in the absorption spectrum, which is merely 15-20 nm in the case of D-π-A, and D-A-π-A dye architectures. Therefore the complementary dyes for the co-sensitization purpose need to be chosen from same family of D-A-D dyes with high extinction coefficients.

Accordingly, indoline and aniline donors based visible active unsymmetrical squaraine dyes is designed and synthesized. Further, structural optimization for the better DSSC device performance is carried out by introducing in-plane and out-of plane alkyl groups at the N- and $sp^3$-C atoms of the indoline units and N-methylation at the aniline donor. Co-sensitization of visible active AK dyes with vinylene moiety extended unsymmetrical squaraine dyes, SQ1 and SQS4, to cover the far-red region is explored to achieve the panchromatic IPCE response.

OBJECTS OF THE INVENTION

The main objective of the present invention is to provide an unsymmetrical squaraine dye of formula (I).

Formula (I)

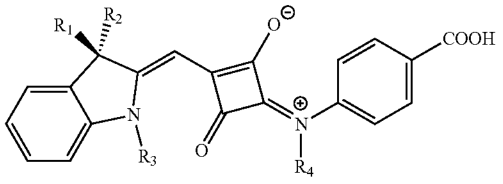

Another objective of the present invention is to provide a process for preparation of an unsymmetrical squaraine dye of formula (I).

Yet another objective of the present invention is to provide an electronic device comprising an unsymmetrical squaraine dye of formula (I).

SUMMARY OF THE INVENTION

Accordingly, the present invention provides unsymmetrical squaraine dyes of formula (I) comprising:

Formula (I)

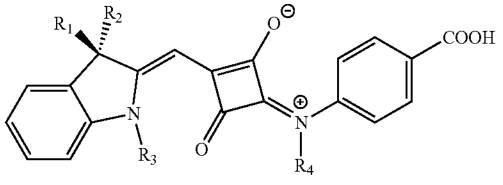

wherein, $R_1$ to $R_4$ are same or different selected from hydrogen, straight or branched chain C1 to 20 alkyl, C1 to C20 alkoxy, aryl, arylalkyl, fused aryl polyethylene glycol units (triethyleneglycol monomethylether, tetraethylene glycol monomethylether), C1 to C10 perfluoroalkyl chains, halides, cyano, and trifluoromethyl.

In an embodiment, the present invention provides an unsymmetrical squaraine dye of formula (I), wherein said squaraine dye of formula (I) is selected from 4-((4-carboxyphenyl)iminio)-3-oxo-2-((-1,3,3-trimethylindolin-2-ylidene)methyl)cyclobut-1-en-1-olate (3, AK1), 4-((4-carboxyphenyl)(methyl)iminio)-3-oxo-2-((-1,3,3-trimethylindolin-2-ylidene)methyl)cyclobut-1-en-1-olate (4, AK2), 4-((4-carboxyphenyl)iminio)-2-(((S)-3-decyl-1,3-didodecylindolin-2-ylidene)methyl)-3-oxocyclobut-1-en-1-olate (5, AK3), 4-((4-carboxyphenyl)(methyl)iminio)-2-(((S)-3-decyl-1,3-didodecylindolin-2-ylidene)methyl)-3-oxocyclobut-1-en-1-olate (6, AK4), 4-((4-carboxyphenyl)(hexyl)iminio)-2-(3-decyl-1,3-didodecylindolin-2-ylidene)methyl)-3-oxocyclobut-1-en-1-olate (AM1), 4-((4-carboxyphenyl)(2-ethylhexyl)iminio)-2-(3-decyl-1,3-didodecylindolin-2-ylidene)methyl)-3-oxocyclobut-1-en-1-olate (AM2), 4-((4-carboxyphenyl)(phenyl)iminio)-2-(-3-decyl-1,3-didodecylindolin-2-ylidene)methyl)-3-oxocyclobut-1-en-1-olate (AM3).

The present invention further provides a process for the preparation of unsymmetrical squaraine dye of formula (I), wherein said process comprising the steps of:

a) refluxing the reaction mixture of 3-cycloalkene-1,2-dione compound dissolved in acetone solvent and aqueous HCl and heated at temperature in the range of 80 to 100° C. for the period in the range of 22 to 24 h to afford corresponding semisquaraine compound;
b) refluxing the semisquaraine compound of step (a) and 4-aminobenzoic acid derivatives dissolved in solvent at room temperature and refluxed at temperature in the range of 130 to 140° C. for the period in the range of 10 to 12 h to afford corresponding unsymmetrical squaraine dye.

In preferred embodiment, said 3-cycloalkene-1,2-dione compound is selected from 3-Butoxy-4-((1,3,3-trimethylindolin-2-ylidene)methyl)cyclobut-3-ene-1,2-dione or 3-butoxy-44(3-decyl-1,3-didodecylindolin-2-ylidene)methyl)cyclobut-3-ene-1,2-dione.

In another preferred embodiment, said semisquaraine compound is selected from 3-hydroxy-4-((1,3,3-trimethylindolin-2-ylidene)methyl)cyclobut-3-ene-1,2-dione or 3-((3-decyl-1,3-didodecylindolin-2-ylidene)methyl)-4-hydroxycyclobut-3-ene-1,2-dione.

In yet another preferred embodiment phenyl carboxylic acid is selected from 4-Aminobenzoic acid, 4-(Methylamino)benzoic acid, 4-(hexylamino)benzoic acid, 4-((2-ethylhexyl)amino)benzoic acid, 4-(phenylamino)benzoic acid.

In still another embodiment of present invention, the solvent in step (a) and (b) is selected from acetone, 1-butanol, toluene, chloroform, acetonitrile or mixture thereof and said process is carried out under nitrogen atmosphere.

In still another embodiment, the present invention provides, an electronic device comprising an unsymmetric squaraine dye of formula (I). In still another embodiment, the present invention provides, a solar cell device comprising an unsymmetrical squaraine dye of formula (I), optionally along with at least one other complementary light absorbing dye, wherein said solar cell device is a dye-sensitized solar cell, wherein said complementary light absorbing dye is selected from SQ1 and SQS4, and wherein the dye is present in solution form or in film form and is chemisorbed to a photoactive semiconductor porous material having solar cell efficiency is in the range of 2.5 to 9.5%.

DETAILED DESCRIPTION OF THE INVENTION

Figure 1:
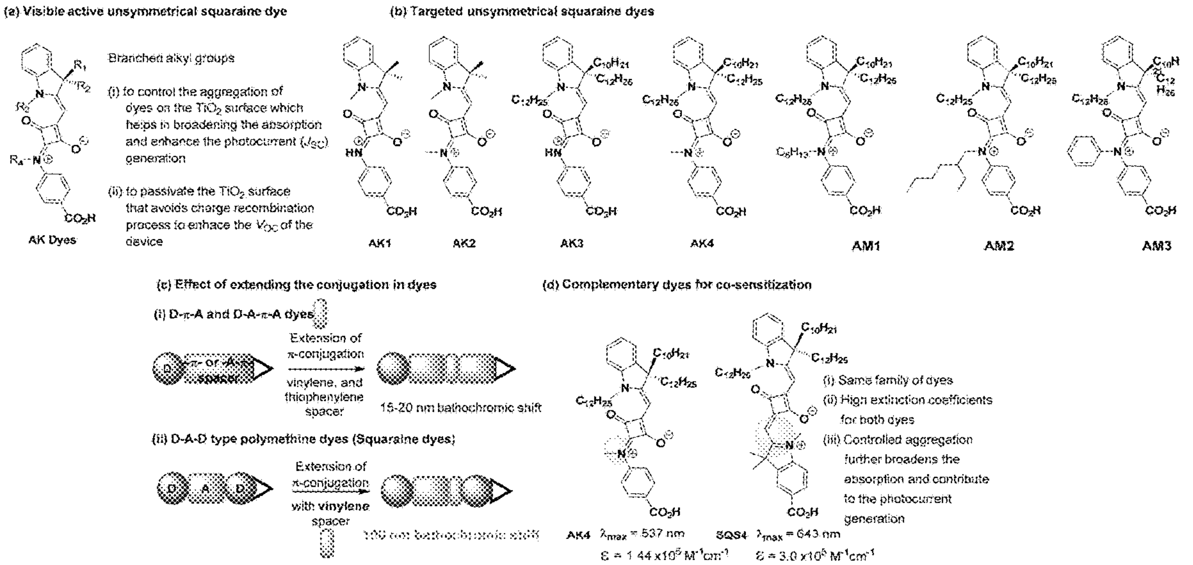
FIG. 1. (a) General structure of visible active unsymmetrical squaraine dyes, (b) Targeted unsymmetrical squaraine dyes with alkyl groups, (c) Effect on the absorption spectrum by extension of conjugation for the sensitizers employed in DSSC and (d) Complementary squaraine dyes for co-sensitized dye-sensitized solar cells.

The present invention disclosed unsymmetrical squaraine dyes of formula (I) comprising:

Formula (I)

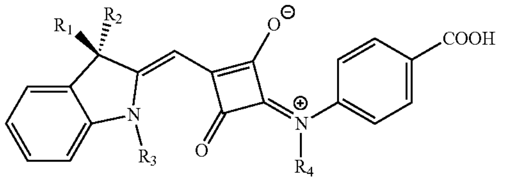

wherein $R_1$ to $R_3$ are same or different selected from hydrogen, straight or branched chain C1 to 20 alkyl (e.g., $CH_3$, $C_{10}H_{21}$, or $C_{12}H_{25}$), C1 to C20 alkoxy, aryl, arylalkyl, fused aryl polyethylene glycol units (triethyleneglycol monomethylether, tetraethylene glycol monomethylether), C1 to C10 perfluoroalkyl chains, halides, cyano, and trifluoromethyl; and $R_4$ is hydrogen, C1 to C20 alkyl (e.g., $CH_3$, hexyl, 2-ethylhexyl, or phenyl), or phenyl group.

In an embodiment, the present invention provides an unsymmetrical squaraine dye of formula (I), wherein said squaraine dye of formula (I) is selected from 4-((4-carboxyphenyl)iminio)-3-oxo-2-((-1,3,3-trimethylindolin-2-ylidene)methyl)cyclobut-1-en-1-olate (3, AK1), 4-((4-carboxyphenyl)(methyl)iminio)-3-oxo-2-((-1,3,3-trimethylindolin-2-ylidene)methyl)cyclobut-1-en-1-olate (4, AK2), 4-((4-carboxyphenyl)iminio)-2-(((S)-3-decyl-1,3-didodecylindolin-2-ylidene)methyl)-3-oxocyclobut-1-en-1-olate (5, AK3), 4-((4-carboxyphenyl)(methyl)iminio)-2-(((S)-3-decyl-1,3-didodecylindolin-2-ylidene)methyl)-3-oxocyclobut-1-en-1-olate (6, AK4), 4-((4-carboxyphenyl)

(hexyl)iminio)-2-(3-decyl-1,3-didodecylindolin-2-ylidene) methyl)-3-oxocyclobut-1-en-1-olate (AM1), 4-((4-carboxyphenyl)(2-ethylhexyl)iminio)-2-(3-decyl-1,3-didodecylindolin-2-ylidene) methyl)-3-oxocyclobut-1-en-1-olate (AM2), 4-((4-carboxyphenyl)(phenyl)iminio)-2-(-3-decyl-1,3-didodecylindolin-2-ylidene)methyl)-3-oxocyclobut-1-en-1-olate (AM3).

The present invention further provides a process for the preparation of unsymmetrical squaraine dye of formula (I), wherein said process comprising the steps of:

a) refluxing the mixture of 3-cycloalkene-1,2-dione compound dissolved in acetone solvent and aqueous HCl at room temperature and heated at temperature in the range of 80 to 100° C. for the period in the range of 22 to 24 h to afford corresponding semisquaraine compound;
b) refluxing the semisquaraine compound of step (a) and phenyl carboxylic acid dissolved in solvent at room temperature and refluxed in the range of 130 to 140° C. for the period in the range of 10 to 12 h to afford corresponding unsymmetrical squaraine dye;

In preferred embodiment, said 3-cycloalkene-1,2-dione compound is 3-Butoxy-4-((1,3,3-trimethylindolin-2-ylidene)methyl)cyclobut-3-ene-1,2-dione or 3-butoxy-4-((3-decyl-1,3-didodecylindolin-2-ylidene)methyl)cyclobut-3-ene-1,2-dione.

In another preferred embodiment, said semisquaraine compound is 3-hydroxy-4-((1,3,3-trimethylindolin-2-ylidene)methyl)cyclobut-3-ene-1,2-dione or 3-((3-decyl-1,3-didodecylindolin-2-ylidene)methyl)-4-hydroxycyclobut-3-ene-1,2-dione.

In yet another preferred embodiment phenyl carboxylic acid is 4-aminobenzoic acid, 4-(methylamino)benzoic acid, 4-(hexylamino)benzoic acid, 4-((2-ethylhexyl)amino)benzoic acid, or 4-(phenylamino)benzoic acid.

In yet still another preferred embodiment, said process is carried out under nitrogen atmosphere.

In yet still another preferred embodiment, said solvent in step (a) is acetone

In yet still another preferred embodiment, said solvent in step (f) is toluene, 1-butanol or a mixture thereof.

A series of indoline and aniline donors based visible active unsymmetrical squaraine dyes is designed and synthesized (FIG. 1*a*). Further, structural optimization for the better DSSC device performance is carried out by introducing in-plane and out-of plane alkyl groups at the N- and sp3-C atoms of the indoline units and N-methylation at the aniline donor (FIG. 1*b*). Regarding the far red absorbing squaraine dye, we have showed the importance of aggregation of SQ1, and SQS4 dyes for broadening absorption profile which also helps to enhance the photocurrent generation. Co-sensitization of visible active AK dyes with vinylene moiety extended unsymmetrical squaraine dyes, SQ1 and SQS4, to cover the far-red region is explored to achieve the panchromatic IPCE response (FIG. 1*d*). SQ1 is 5-carboxy-2-[[3-[(1,3-dihydro-1,3,3-trimethyl-2H-indol-2-ylidene)methyl]-2-hydroxy-4-oxo-2-cyclobuten-1-ylidene] methyl]-1,3,3-trimethyl-3H-indolium. SQS4's chemical structure is shown in FIG. 1*d*.

Synthesis of Visible Active Unsymmetrical Squaraine Dyes.

Synthesis of unsymmetrical squaraine dyes require semi-squaraine or semi-squaric acid intermediate with one of the donors which is then condensed with the second donor. We have adopted the semi-squaric acid route for better reaction yields. The semi-squaraine derivatives 1a and 1b have been synthesized by following a literature known method and then treated with aqueous HCl in acetone for 24 h to provide the corresponding semi-squaric acids 2a and 2b. Further condensing the semi-squaric acid derivatives with 4-aminobenzoic acid or a substituted 4-aminobenzoic acid afforded the AK series of dyes AK1-4 and AM series of dyes AM1-3 in moderate yields. These reactions are illustrated in Scheme 1 below.

Scheme 1

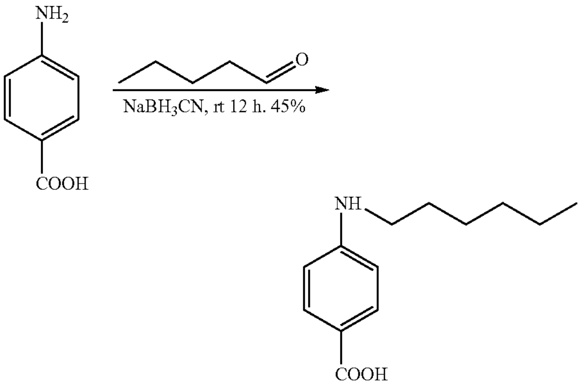

A

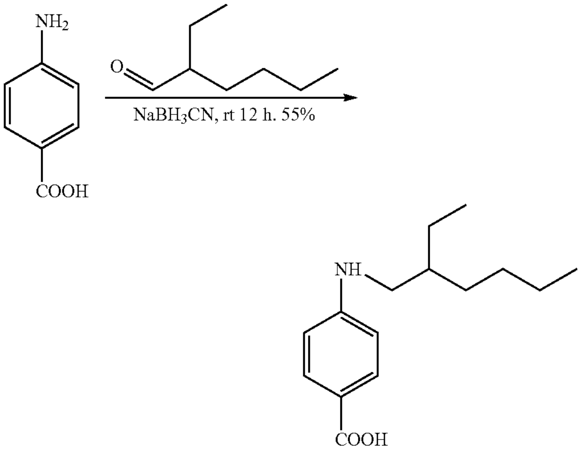

B

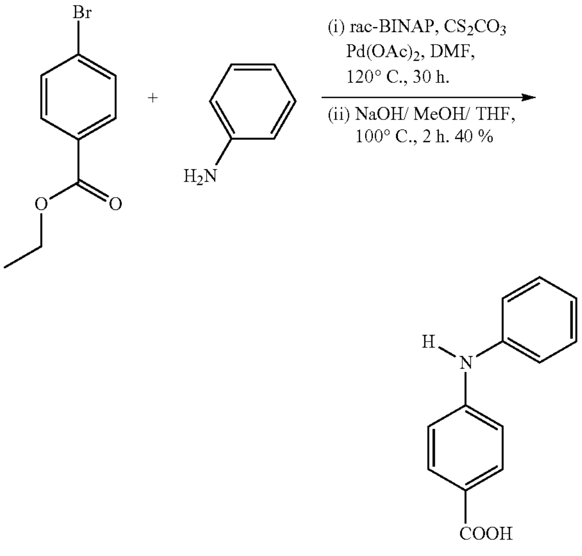

C

-continued

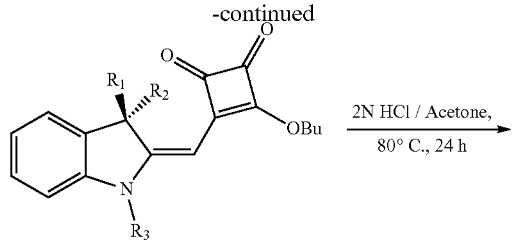

1a, $R_1$, $R_2$ and $R_3$ = $-CH_3$
1b, $R_1$ = $-C_{10}H_{21}$, $R_2$ and $R_3$ = $-C_{12}H_{25}$

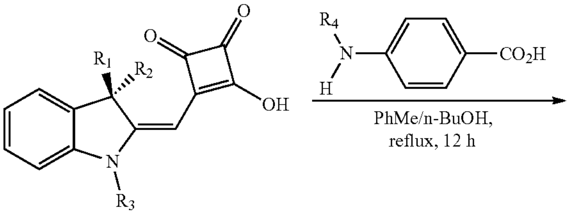

2a, $R_1$, $R_2$ and $R_3$ = $-CH_3$, 78 %
2b, $R_1$ = $-C_{10}H_{21}$, $R_2$ and $R_3$ = $-C_{12}H_{25}$, 60 %

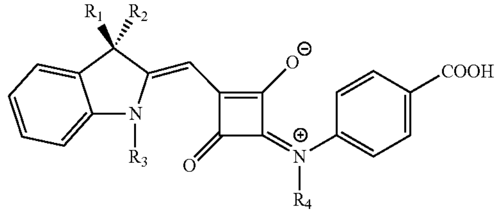

3, $R_1$, $R_2$ and $R_3$ = -Me, $R_4$ = -H, AK1, 69 %
4, $R_1$, $R_2$, $R_3$ and $R_4$ = -Me, AK2, 60 %
5, $R_1$ = $-C_{10}H_{21}$, $R_2$ and $R_3$ = $-C_{12}H_{25}$, $R_4$ = -H, AK3, 60 %
6, $R_1$ = $-C_{10}H_{21}$, $R_2$ and $R_3$ = $-C_{12}H_{25}$, $R_4$ = -Me, AK4, 55 %
7, $R_1$ = $-C_{10}H_{21}$, $R_2$ and $R_3$ = $-C_{12}H_{25}$, $R_4$ = $-C_6H_{13}$, AM1, 46 %
8, $R_1$ = $-C_{10}H_{21}$, $R_2$ and $R_3$ = $-C_{12}H_{25}$, $R_4$ = -2-Ethyl hexyl, AM2, 42 %
9, $R_1$ = $-C_{10}H_{21}$, $R_2$ and $R_3$ = $-C_{12}H_{25}$, $R_4$ = -Ph, AM3, 38 %

Photophysical and Electrochemical Properties.

Figure 2:
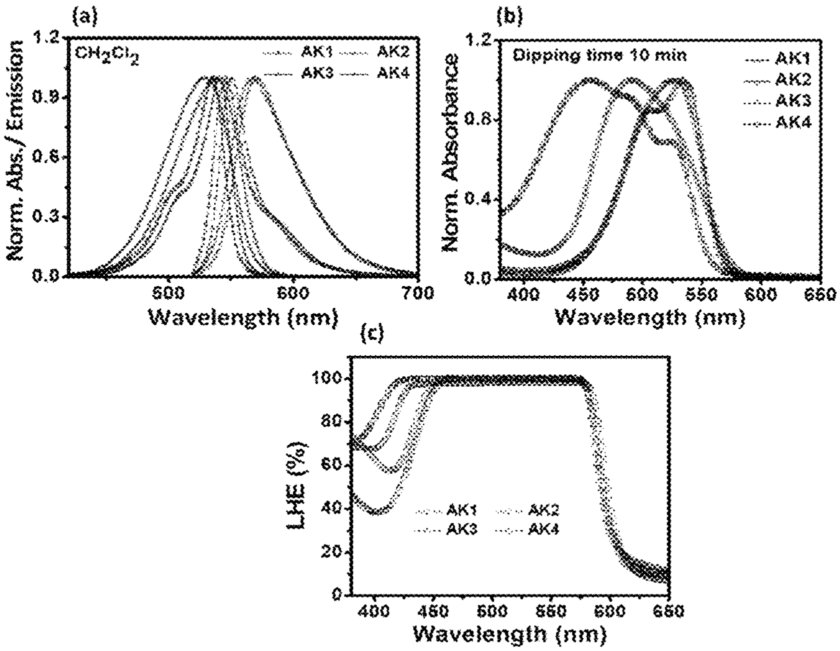
FIG. 2. (a) Normalized UV-Vis (solid) and fluorescence (dotted) spectra of AK dyes in $CH_2Cl_2$ solution, (b) UV-Vis spectra of AK dyes on $TiO_2$ (thickness of the $TiO_2$ electrode 6 □m, dipping time 10 min) and (c) LHE ($=1-10^{-A}$) profiles of AK dyes on $TiO_2$ electrodes (thickness 6 μm, dipping time 12 h).

The UV-vis spectra of AK1-AK4 dyes in $CH_2Cl_2$ showed intense peak between 529-541 nm with the extinction coefficients of 1.44-1.84×$10^5$ $M^{-1}cm^{-1}$ (FIG. 2, Table 1). Introducing alkyl groups at the $sp^3$-C and N-atoms of indoline unit bathochromically shift the $\lambda_{max}$ by 6 nm (AK1 vs AK3), whereas introducing N-methyl group at the arylamino donor unit shifts 6 nm hypsochromically (AK1 vs AK2). It is known that solvent-solute interaction is the main reason for the observation of the red shifted transitions, and N-methylation around squaric acid might distort the planarity to observe the blue shifted transitions. Hence the $\lambda_{max}$ observed for AK4 as a net result of hypochromic shift due to N-methyl group which distort the planarity of the molecule and bathochromic shift due to the solvent solute interaction. Further introducing N-methyl group at the arylamino donor unit broadens the UV-vis spectra of AK2 and AK4 compared to AK1 and AK3. Fluorescence emission between 546-571 nm with the Stokes's shift of 9-11 nm for the AK3, AK1 and 34-38 nm for AK4 and AK2 dyes, respectively upon exciting at 500 nm. Hence the effect of N-methylation at the arylamino donor leads to larger Stoke's shift indicates the change in dipole moment for AK2 and AK4 dyes in the excited state. To understand the aggregation of AK dyes on $TiO_2$, dipping the $TiO_2$ electrode (thickness 6 μm) in AK dye solutions for a short time, 10 min, is carried out. All the AK dyes showed blue shifted peaks due to the formation of H-aggregate as wells as deprotonation of carboxylic acid upon adsorption on $TiO_2$ surface. AK1 dye showed peaks at 523 nm, 488 nm, and 457 nm which can be assigned to monomer, dimer and aggregated dyes, respectively. In the case of AK2 dye, the peak was broad and blue shifted 38 nm on $TiO_2$. Further, AK3 and AK4 dyes showed 6 and 10 nm blue shifted peaks compared to the spectrum in solution with dimer peak at 506 nm for AK3. Hence introducing alkyl groups at the $sp^3$-C and N-atoms of indoline unit controls the aggregation of dyes on the surface (FIG. 2*b*). The light harvesting property of AK1-4 dyes on $TiO_2$ electrode are good between 420-600 nm, introduction of alkyl groups leads to narrow down the LHE response for the AK3 and AK4 dyes due to the reduced aggregation of dyes on the $TiO_2$ surface (FIG. 2*c*).

Figure 3:
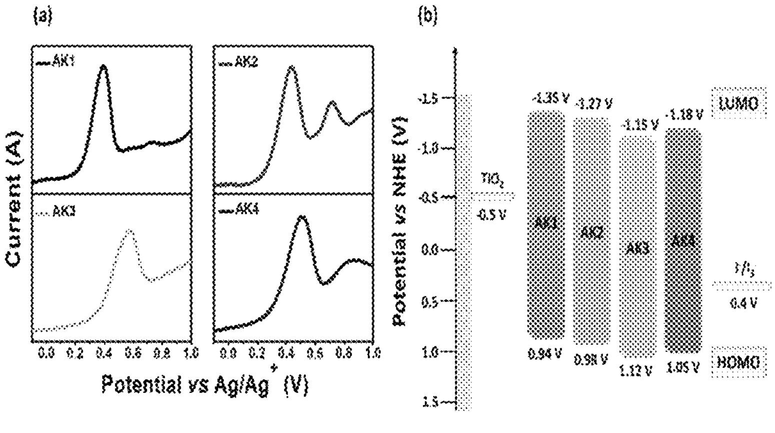
FIG. 3. (a) Differential pulse voltammograms of AK1-4 dyes in $CH_2Cl_2$, and (b) energy level diagram of HOMO and LUMO of the AK1-4 dyes with the conduction band of $TiO_2$ and the redox function of $I^-/I_3^-$ electrolyte.

To evaluate the charge injection and dye regeneration properties of the AK1-4 dyes, differential pulse voltammetry experiment was carried out (FIG. 3*a*), and cyclic voltammograms with and without ferrocene/ferrocene$^+$ (FIG. 10). Further it is better to have sufficient potentials for driving both charge injection (300 mV), and dye regeneration (500 mV) processes. From the first oxidation potential of the AK1-4 dyes, the HOMO energy level is calculated. The LUMO energy level is calculated by incorporating the optical band gap which is obtained by both absorption and emission spectroscopy. The HOMO and LUMO energy levels for the dyes is found to be in the range of 0.94-1.12 eV (vs NHE) and −1.35-−1.15 eV (vs NHE), respectively (FIG. 3, Table 1). Hence all the dyes, AK1-4, are potential sensitizer for fabricating the DSSC device by using $TiO_2$ as a photoanode and $I^-/I_3^-$ as an electrolyte, as the availability of sufficient over potentials for charge injection (energy difference between LUMO of the dye and conduction band of $TiO_2$, more than 0.65 V), and dye regeneration processes (energy difference between HOMO of the dye and redox function of the electrolyte, more than 0.54 V).

Photovoltaic Performance.

Figure 4:
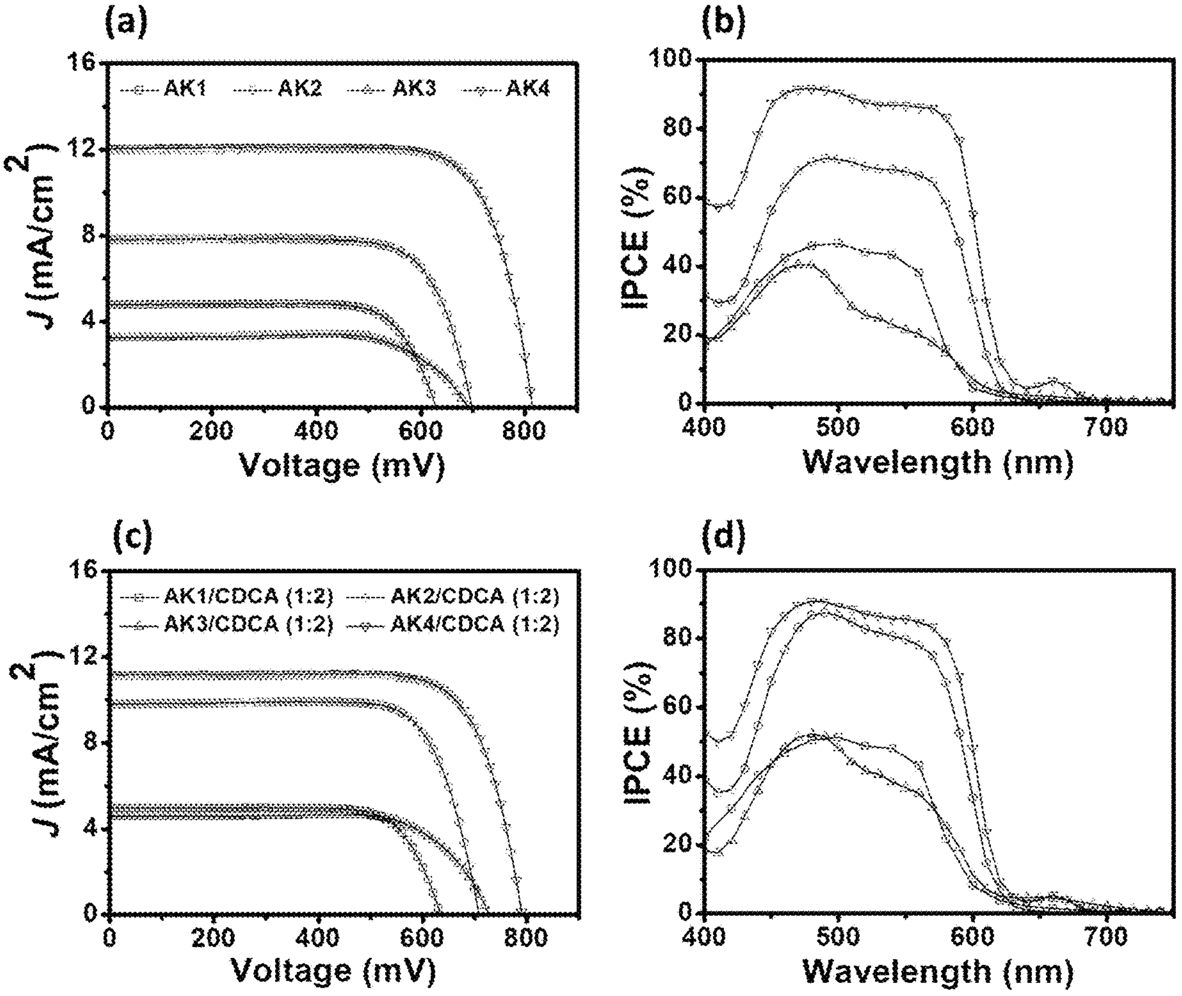
FIG. 4. (a and c) I-V curves for AK1-AK4 dyes without and with CDCA, (b and d) IPCE curve for AK1-AK4 dyes without and with CDCA.

The result on the photovoltaic performances by fabricating the DSSC devices is provided in FIG. 4 (Table 2). DSSC device efficiencies of 2.52%, 4.38%, 1.73% and 7.93% were obtained for AK1, AK2, AK3 and AK4 dyes without co-adsorbing with CDCA. Further the device performances were increased to 2.49%, 5.50%, and 2.59%, respectively for AK1, AK2 and AK3 dyes in the presence of 2 equivalents of CDCA, whereas the device performance is decreased to 6.94% for AK4 in the presence of CDCA. The effect of N-methylation at the aniline donor unit and alkyl groups at the $sp^{\alpha}$-C, N-atoms of indoline have profound effect on the $V_{oc}$ of the devices. N-methylation at the arylamino donor unit improved the $V_{oc}$ about 70 mV for AK2 (compared to AK1), and alkyl groups at the indoline units improved the $V_{oc}$ about 60 mV for AK3 (compared to AK1). However, in the case of AK4, appending alkyl groups at the indoline unit and N-methyl group at the aniline donor unit increased the $V_{oc}$ about 185 mV, compared to AK1. It is the highest $V_{oc}$ (815.88 mV) for the zwitterionic dye with the $I^-/I_3^-$ electrolyte. Along with $V_{oc}$, $J_{sc}$ also synergistically improved by appending the alkyl groups. The IPCE profile for all the AK dyes showed the maximum response at 475-490 nm, and it is correspond to the H-aggregates of the respective dyes. Further co-adsorbing the dye with CDCA (2 equivalents) has improved the IPCE response without changing the shape of the profile, which indicates that the better dye-dye interaction on the surface. It is understood from the DFT, and UV-vis studies that appending N-methyl group in AK2 make non planarity around the framework of squaraine unit which may help reducing the charge recombination pathways.

To understand the IPCE responses from monomeric dyes, the photoanode coated with $TiO_2$ (Thickness of $TiO_2$ 8+4 μm, area 0.23 $cm^2$) was first saturated with coadsorbent CDCA for 12 h (1.0 mM in MeCN) and further dipped in dye solution for 2 min (0.1 or 0.2 mM in MeCN) (Table 1).

TABLE 1

Photovoltaic performance of SQ dyes.

| Dyes | $V_{oc}$(mV) | $J_{sc}$(mA/$cm^2$) | ff (%) | η (%) |
|---|---|---|---|---|
| AK1[a] | 592.84 | 0.77 | 69 | 0.31 |
| AK2[a] | 626.20 | 1.49 | 82 | 0.76 |
| AK3[b] | 638.39 | 1.65 | 78 | 0.82 |
| AK4[b] | 662.12 | 2.21 | 80 | 1.17 |
| AK2:SQ1 (1:1)[c] | 650.87 | 4.33 | 80 | 2.25 |
| AK2:SQS4 (1:1)[c] | 670.12 | 4.94 | 76 | 2.51 |
| AK4:SQ1 (1:1)[c] | 664.56 | 4.71 | 80 | 2.50 |
| AK4:SQS4 (1:1)[c] | 687.36 | 4.81 | 78 | 2.58 |

[a] $CH_3CN$:DMSO (95:5),
[b] $CH_3CN$:$CHCl_3$ (85:15),
[c] $CH_3CN$:DMSO:$CHCl_3$ (90:5:5)

The maximum power conversion efficiency of 7.44, 7.22, 5.41, and 7.99% have been achieved for AM1, AM2, AM3, and AK4 dyes in the absence of CDCA, respectively with $I^-/I_3^-$ electrolyte (Table 2). AM2 dye with ethylhexyl alkyl group on the N-atom of amine donor gave highest $V_{OC}$ of 865 mV in AM dye series. The maximum power conversion efficiency of 8.05, 7.96, 5.84, and 7.98%, and $V_{OC}$ of 1030, 1025, 1001, and 1009 mV have been achieved for AM1, AM2, AM3, and AK4 dyes in the absence of CDCA, respectively with Cu(I/II) electrolyte (Table 3). AM1 dye showed the highest achieved DSSC device efficiency of 8.05%, and $V_{OC}$ of 1030 mV for D-A-D based unsymmetrical squaraine dyes first time. IPCE response of AM and AK4 dyes showed the maximum participation from the aggregated structures in the generation of photocurrents, and the highest IPCE response has been observed for the AK4 dye with both $I^-/I_3^-$ and Cu(I/II) electrolytes and reason for the high photocurrent. Further addition of CDCA decreased the intensity of IPCE profiles and reason for the decreased $J_{SC}$ and efficiency of the DSSC device for AM and AK4 dyes with $I^-/I_3^-$ electrolyte.

TABLE 2

Optimized DSSC performances of AM and AK4 dyes with and without (CDCA).

| Dyes | CDCA (Equiv.) | $V_{OC}$ (mV) | $J_{SC}$ (mA/$cm^2$) | ff (%) | η (%) |
|---|---|---|---|---|---|
| AM1 | 0 | 855 ± 3 | 10.61 ± 0.23 | 79 ± 1.06 | 7.17 ± 0.27 |
| AM1 | 1 | 844 ± 2 | 10.23 ± 0.17 | 77 ± 1.18 | 6.65 ± 0.22 |
| AM2 | 0 | 863 ± 2 | 10.15 ± 0.20 | 80 ± 0.69 | 7.08 ± 0.14 |
| AM2 | 1 | 849 ± 1 | 9.65 ± 0.25 | 83 ± 1.07 | 6.80 ± 0.27 |
| AM3 | 0 | 806 ± 2 | 8.41 ± 0.16 | 77 ± 1.13 | 5.22 ± 0.19 |
| AM3 | 1 | 790 ± 2 | 8.02 ± 0.22 | 76 ± 1.61 | 4.82 ± 0.24 |
| AK4 | 0 | 844 ± 3 | 11.60 ± 0.18 | 79 ± 1.05 | 7.73 ± 0.26 |
| AK4 | 1 | 833 ± 3 | 10.98 ± 0.13 | 80 ± 0.43 | 7.32 ± 0.15 |

TABLE 3

Optimized DSSC performances of AM and AK4 dyes in the absence of CDCA with Cu(I/II) electrolyte.

| Dyes | Electrolyte | $V_{OC}$(mV) | $J_{SC}$(mA/$cm^2$) | ff (%) | η (%) |
|---|---|---|---|---|---|
| AM1 | Cu (I/II) | 1026 ± 4 | 10.10 ± 0.15 | 75 ± 1.22 | 7.77 ± 0.28 |
| AM2 | Cu (I/II) | 1023 ± 2 | 9.61 ± 0.06 | 79 ± 1.31 | 7.76 ± 0.20 |
| AM3 | Cu (I/II) | 999 ± 2 | 8.12 ± 0.11 | 70 ± 0.92 | 5.67 ± 0.17 |
| AK4 | Cu (I/II) | 1002 ± 7 | 10.40 ± 0.13 | 74 ± 1.14 | 7.71 ± 0.27 |

The electrochemical impedance spectroscopy studies were conducted and the charge transfer ($R_{ct}$) is calculated for electrolyte/Pt electrode interface, dye-$TiO_2$/electrolyte interfaces. The $R_{ct}$ decreases in the order AK4 (12.57 ohm)>AK2 (7.62 ohm)>AK3 (6.23 ohm)>AK1 (5.68 ohm). The chemical capacitance is also decreased in the order of AK4>AK2>AK3>AK1.

Co-Sensitization of Complementary Unsymmetrical Squaraine Dyes.

Figure 5:
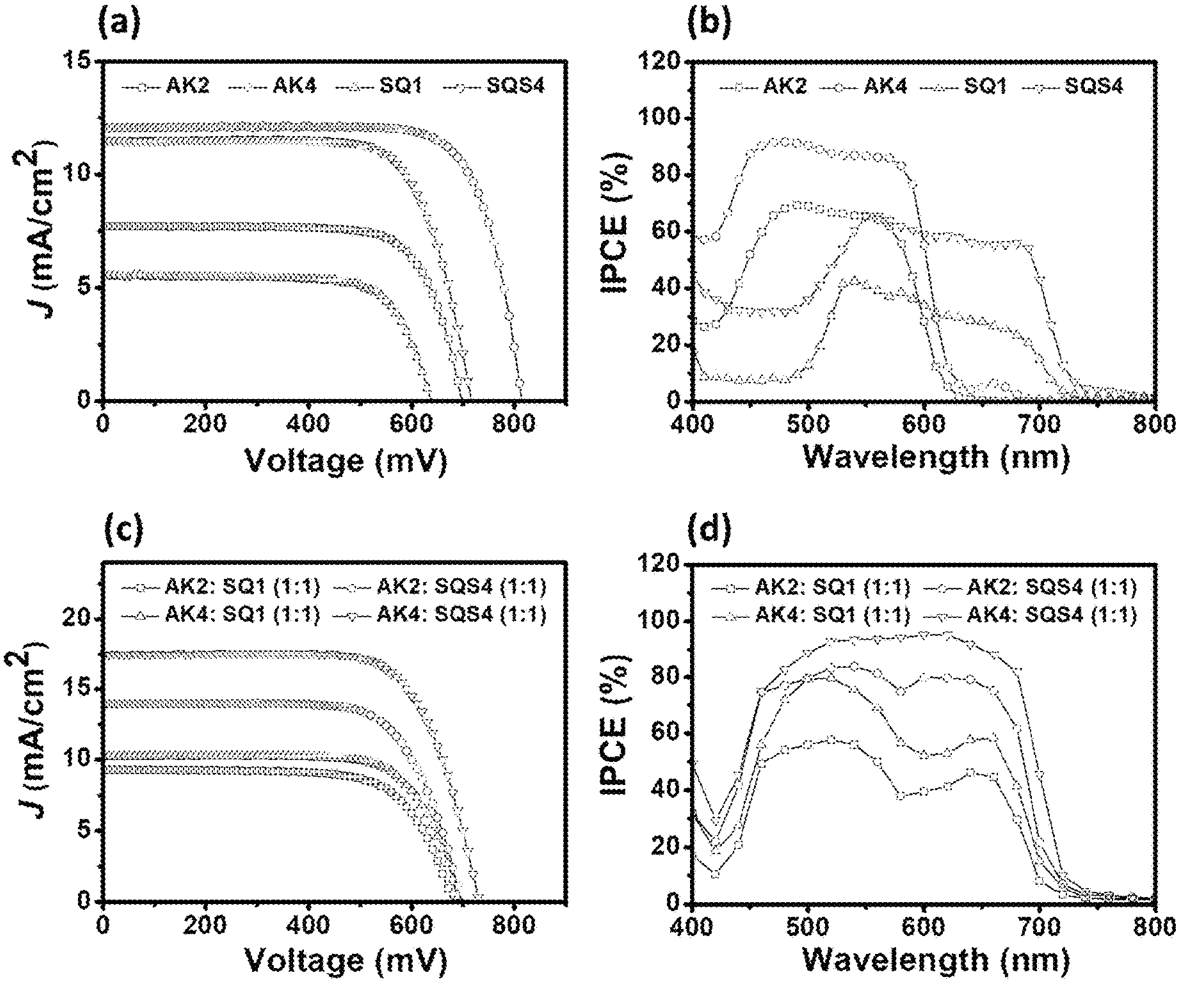
FIG. 5. (a) I-V curves for AK2, AK4, SQ1 and SQS4 sensitized DSSC devices, (b) IPCE profile for AK2, AK4, SQ1 and SQS4 sensitized DSSC devices without CDCA, (c) I-V curves for co-sensitized DSSC devices of AK2+SQ1, AK2+SQS4, AK4+SQ1 and AK4+SQS4 DSSC devices and (d) IPCE profile for AK2+SQ1, AK2+SQS4, AK4+SQ1 and AK4+SQS4 co-sensitized DSSC devices.
Figure 6:
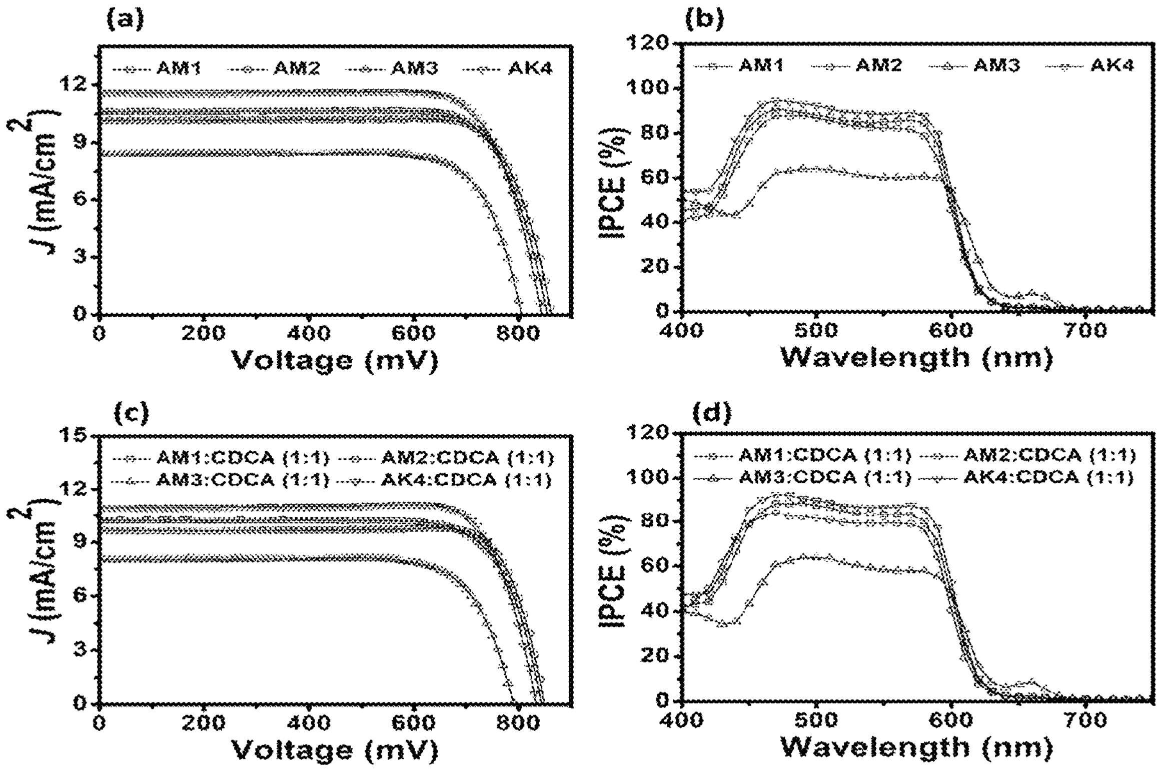
FIG. 6 (a) I-V, and (b) IPCE curves for AM and AK4 dyes without CDCA, (c) I-V, and (d) IPCE curves for AM and AK4 dyes with CDCA.
Figure 7:
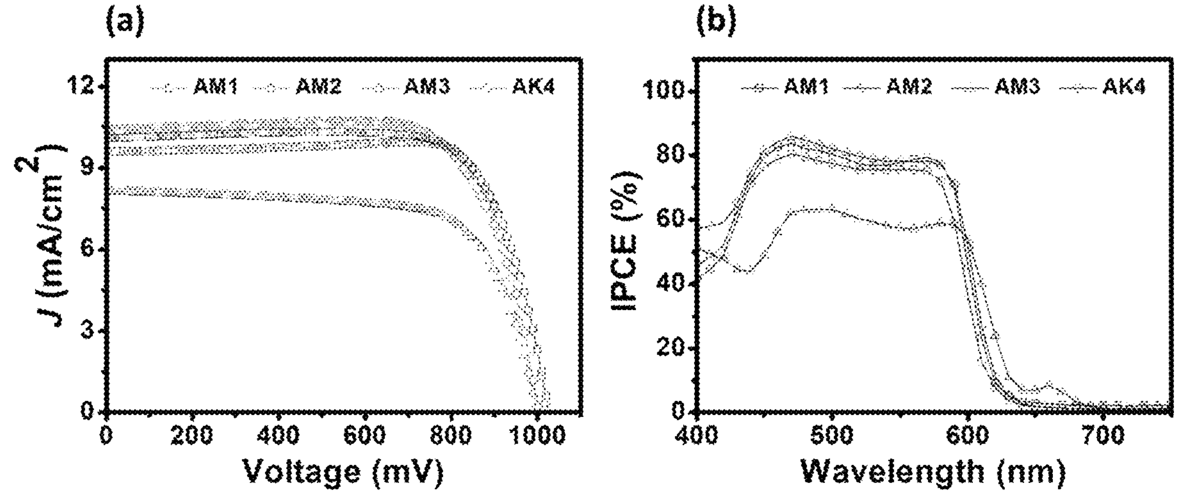
FIG. 7. (a) I-V, and (b) IPCE curves for AM and AK4 dyes in the absence of CDCA with Cu(I/II) electrolyte.

For the efficient co-sensitized dye-sensitized solar cells, complementary light absorbing dyes with high extinction coefficients is required. AK and SQ dyes have $\lambda_{max}$ in the regions of 529-541 nm and 642-650 nm, respectively with the extinction coefficients in the order of $10^5 M^{-1} cm^{-1}$. Dyes AK2 and AK4 showed better device performance than AK1 and AK3 with the IPCE response more than 80% in the 450-610 nm regions. Inventors showed recently that indoline based unsymmetrical SQS4 dye showed better device performance in the region of 550-700 nm. AK2, AK4 and SQS4 dyes have contributed to the photo current generation from the aggregated state even in the presence of co-adsorbent CDCA. The model indoline based squaraine dye; SQ1 (without any alkyl groups) showed the IPCE response of 36% at 536 nm which from the aggregated dye structures on $TiO_2$, and in the presence of CDCA, the obtained photocurrent response is only from the monomeric structures. Hence the stability of monolayer formation with the co-sensitized dyes is very important on the $TiO_2$ surface, and it should not happen that the formation of self-assembled structure is disturbed by the complementary dye. Hence in order to optimize a best pair of complementary dyes for the better co-sensitized device performance, dyes SQ1, SQS4, AK2 and AK4 were chosen The normalized absorption spectra of AK4 and SQS4 is provided in and the LHE profile of the individual dye as well as combined dye showed the potential light harvesting ability from 450-700 nm. The individual device performance is provided in (Table 4). Co-sensitized devices for the AK2+SQ1, AK2+SQS4, AK4+SQ1 and AK4+SQS4 dye combinations with the ratio of 1:1 are carried out without CDCA (FIGS. 5*c* and 5*d*). AK2+SQS4 device performed better with 7.0% ($V_{oc}$ 698 mV, $J_{sc}$ 14.06 mA/$cm^2$) than AK2+SQ1 (4.59%, $V_{oc}$ 679 mV, $J_{sc}$ 9.53 mA/$cm^2$). Highest device performance is obtained for the AK4+SQS4 dye combination with 9.36% ($V_{oc}$ 733 mV, $J_{sc}$ 17.75 mA/$cm^2$) with the good IPCE response over a large part of the visible and far-red regions of the solar spectrum. Dye combination of AK4+SQ1 showed the device efficiency of 5.43% ($V_{oc}$ 694 mV, $J_{sc}$ 10.65 mA/$cm^2$). The high device performance of AK4+SQS4 combination may be due to the long alkyl chains present in the both the dyes, effectively control the aggregation. Further addition of CDCA reduces the device performance (FIG. 4 and Table 5).

TABLE 4

| Photovoltaic parameters for the co-sensitized DSSC devices (active area and black mask size was 0.23 $cm^2$). | | | | |
|---|---|---|---|---|
| Dyes | $V_{oc}$ (mV) | $J_{sc}$ (mA/$cm^2$) | ff (%) | η (%) |
| AK2[a] | 699.12 ± 1.22 | 7.80 ± 0.44 | 75 ± 0.87 | 4.09 ± 0.29 |
| AK4[b] | 814.60 ± 1.28 | 12.05 ± 0.35 | 78 ± 0.37 | 7.65 ± 0.28 |
| SQ1[a] | 637.22 ± 1.05 | 5.50 ± 0.21 | 73 ± 0.69 | 2.56 ± 0.13 |
| SQS4[b] | 716.87 ± 1.12 | 11.52 ± 0.37 | 72 ± 0.61 | 5.94 ± 0.25 |
| AK2:SQ1 (1:1)[c] | 678.93 ± 0.36 | 9.27 ± 0.26 | 70 ± 0.91 | 4.41 ± 0.18 |
| AK2:SQS4 (1:1)[c] | 697.41 ± 0.65 | 13.89 ± 0.17 | 71 ± 0.39 | 6.88 ± 0.12 |
| AK4:SQ1 (1:1)[c] | 692.80 ± 0.76 | 10.22 ± 0.43 | 73 ± 0.55 | 5.17 ± 0.26 |
| AK4:SQS4 (1:1)[c] | 731.96 ± 1.32 | 17.46 ± 0.29 | 71 ± 0.93 | 9.08 ± 0.28 |

[a]$CH_3CN$:DMSO (95:5),
[b]$CH_3CN$:$CHCl_3$ (95:5),
[c]$CH_3CN$:DMSO:$CHCl_3$ (90:5:5)

TABLE 5

| Photovoltaic performance of SQ dyes. | | | | | |
|---|---|---|---|---|---|
| Dyes | CDCA ratio | $V_{oc}$ (mV) | $J_{sc}$ (mA/$cm^2$) | ff (%) | η (%) |
| AK4: SQS4 (1:1)[a] | 0 | 731.96 ± 1.32 | 17.46 ± 0.29 | 71 ± 0.53 | 9.08 ± 0.23 |
| AK4: SQS4 (1:1)[b] | 0 | 728.26 ± 0.63 | 17.80 ± 0.51 | 70 ± 0.13 | 9.07 ± 0.27 |
| AK4: SQS4 (1:1)[b] | 2 | 722.78 ± 0.77 | 16.13 ± 0.81 | 71 ± 0.32 | 8.28 ± 0.46 |

[a]$CH_3CN$:DMSO:$CHCl_3$ (90:5:5), [b]$CH_3CN$:$CHCl_3$ (95:5)

EXAMPLES

Following examples are given by way of illustration and therefore should not be construed to limit the scope of the invention.

EXPERIMENTAL

Required precursors for the synthesis of AK dyes; 1a, 1b, SQS4 and SQ1 were synthesized by the following the procedure present in the literature, and 4-Aminobenzoic acid, 4-(Methylamino)benzoic acid are commercially available compounds and AM1, AM2 and AM3 dyes were synthesized from the following procedure available in literature.

Chemicals and reagents required for the synthesis of/AKAM dyes were purchased from commercial sources, and standard procedures are used for drying PhMe. $^1$H and $^{13}$C NMR were recorded on Bruker NMR spectrometers AV 200 MHz, AV 400 MHz and AV-500 MHz frequency, in $CDCl_3$. Bruker FTIR spectrometer has been used to measure the IR-spectrum of AM dyes. Absorption spectra of AM dyes were recorded on SPECORD® 210/PLUS, Analytikjena UV-Visible spectrophotometer at room temperature. Emissions of AK/AM dyes were recorded on Edinburgh spectrofluorometer FS5 at room temperature. For the light-harvesting efficiency (LHE) calculation, 6 μm thin film of $TiO_2$ coated on the transparent glass slide was dipped in 0.1 mM AK/AM dye solution for 12 h at room temperature, and absorbance spectra converted in light-harvesting efficiency ($LHE=1-10^{-A}$). Differential pulse voltammetric (DPV) and cyclic voltammetric (CV) studies of AK/AM dyes were performed on BioLogic SP300 potentiostat in anhydrous $CH_2Cl_2$ solvent, at 25° C. under an inert atmosphere, where platinum wire as a working electrode, platinum foil as a counter electrode, non-aqueous $Ag/Ag^+$ (0.01M) as a reference electrode, $TBAClO_4$ (0.05 M) as supporting electrolyte, and Ferrocene/Ferrocene$^+$ as the internal-standard, scan rate of 100 and 50 mV $s^{-1}$ for DPV, and CV respectively. Electropolymerization of EDOT onto the FTO were performed on BioLogic SP300 potentiostat at 25° C., where cleaned FTO have been used as a working electrode, platinum foil as a counter electrode, non-aqueous Ag/Ag+ (0.01M) as a reference electrode. Solution for electropolymerization were prepared from a mixture of 0.01 M of 3,4-ethylenedioxythiophene (EDOT) and 0.1 M of lithium perchlorate (LiC104) in anhydrous acetonitrile by sonicating for 5 min Electropolymerization were performed under in potentiostatic mode of chronoamperometry with 2.0 V voltage for 120 seconds, deposited films onto the FTO were washed with acetonitrile and dried. Electrochemical impedance measurements (EIS) were performed using a BioLogic SP300 potentiostat equipped with a frequency response analyzer. EIS studies were carried out in dark with various applied potential and frequency ranges from 3 MHz to 10 mHz with sinus amplitude of 10 mV. For I-V characteristics of the cells were measured by using PHOTO EMISSION TECH (PET, CT200AAA, USA) solar-simulator, and IPCE measurements were carried out with a Newport QE measurement kit. $[Cu(tmby)_2]^{+/2+}$ based redox couple were prepared from 0.20 M bis-(4,4',6,6'-tetramethyl-2,2'-bipyridine) copper(I) bis(trifluoromethanesulfonyl)imide, 0.04 M bis-(4,4',6,6'-tetramethyl-2,2'-bipyridine)copper(II) bis[bis (trifluoromethanesulfonyl)imide], 0.10 M Bis (trifluoromethylsulfonyl)amine lithium salt, and 0.60 M 4-tert-Butylpyridine in acetonitrile (inside of glove-box). [1]EZ-Melt automated melting point apparatus used for the melting point measurement of all solid compounds.

[A] Synthesis of Amine Carboxylic Acid

Example 1: 4-(hexylamino) benzoic acid (1)

4-Amino benzoic acid (1 g, 9.99 mmol) was dissolved in 20 mL of ethanol in a single neck round bottom flask. While stirring and cooling with an ice bath hexanal (1.3 g, 9.99 mmol) was added over the reaction round bottom flask and the solution was stirred for 10 min Sodiumcyano trihydroborate (627 mg, 9.99 mmol) was dissolved in ethanol (10 mL) subjected in to reaction drop wise and the reaction mixture was stirred at 0° C. for 1 h than allowed to warm at room temperature stirring for 12 h the solvent was evaporated and a white solid part quince by adding 1 N aqueous HCl. After 15 minute of the reaction time the white precipitate was filtered and washes with water until the filtrate was neutral. The product was crystalized with using ethanol-water (4:1) and solvent removed under reduced pressure than high vacuum pressure pump. Yield: 1 g, 45%. $^1$H NMR (200 MHz, $CDCl_3$): δ 0.82-1.03 (m, 3H) 1.25-1.49 (m, 6H) 1.54-1.80 (m, 2H) 3.18 (t, J=7.06 Hz, 2H) 6.56 (m, J=8.82 Hz, 2H) 7.83-8.04 (m, 2H).

Example 2: 4-((2-ethylhexyl)amino) benzoic acid (2)

4-Amino benzoic acid (1 g, 7.29 mmol) was dissolved in 20 mL of ethanol in a single neck round bottom flask. While stirring and cooling with an ice bath 2-ethylhexanal (1.15 g, 8.75 mmol) was added and the solution was stirred for 10 min, sodiumcyano trihydroborate (458 mg, 7.29 mmol) was dissolved in ethanol (10 mL) subjected in to reaction drop wise and the reaction mixture was stirred at 0° C. for 1 h than allowed to warm at room temperature stirring for 12 h the solvent was evaporated then reaction mixture quince by adding 1 N aqueous HCl. After 15 minute of the reaction time organic layer separated with using $CH_2Cl_2$ (30 mL×3) times and dried over $Na_2SO_4$ and solvent removed under reduced pressure and purified with using pet ether and EtOAc. Yield: 1 g, 55%. $^1$H NMR (200 MHz, DMSO-$d_6$): δ 0.80-0.93 (m, 7H) 1.15-1.43 (m, 9H) 1.53 (d, J=5.73 Hz, 1H) 2.96 (t, J=5.84 Hz, 2H) 6.39 (t, J=5.35 Hz, 1H) 6.57 (m, J=8.82 Hz, 2H) 7.66 (m, J=8.71 Hz, 2H) 11.95 (br. s., 1H).

Example 3: 4-(phenylAmino)benzoic acid (3)

Step 1: To a solution of ethyl 4-bromobenzoate (500 mg, 2.2 mmol), aniline (254 mg, 2.72 mmol), $CS_2CO_3$ (1.06 g, 3.27 mmol), rac-BINAP (100 mg, 0.16 mmol) and $Pd(OAc)_2$ (40 mg, 0.178 mmol) were dissolved in DMF (10 mL) in Schlenk tube at room temperature. The reaction mixture was stirred at 120° C. for 30 h, once the reaction appeared to be complete by consumption of 4-bromo ethyl benzoate by TLC analysis. The mixture was allowed to coot to rt, diluted with EtOAc, washed with 2 N HCl (10 mL) solution and brine, dried over $Na_2SO_4$ and concentrate it proceed for next step without purification.

Step 2: the crude mixture (400 mg, 1.65 mmol) was dissolved in dry THF (40 mL) and MeOH (40 mL) and a solution of 4 M NaOH (20% w/w in water) was added in round bottom flask 100 mL and heated at 40° C. for 4 h, then checked TLC which indicate the completely hydrolysis of the ester group. After cooling to room temperature 1 M HCl solution was added than organic layer wash with diethyl ether (30 mL×3) times and dried over $Na_2SO_4$ and solvent removed under reduced pressure, purified with using petehter and EtOAc. Yield: 230 mg, 40%. $^1$H NMR (200 MHz, $CDCl_3$): δ 6.09 (br. s., 1H) 6.99 (d, J=8.70 Hz, 2H) 7.04-7.13 (m, 1H) 7.15-7.22 (m, 2H) 7.32-7.41 (m, 2H) 7.95-8.02 (m, 2H)

[B]: Synthesis of Semisquaraine

Example 4: 3-hydroxy-4-((1,3,3-trimethylindolin-2-ylidene)methyl)cyclobut-3-ene-1,2-dione (2a)

3-Butoxy-4-((1,3,3-trimethylindolin-2-ylidene)methyl) cyclobut-3-ene-1,2-dione 1a (2 g, 6.15 mmol) were dissolved in 30 mL of acetone in a single neck round bottom flask followed by the addition of 2 N aqueous HCl 6 mL, resultant mixture were refluxed for 12 h. Solvents were removed under reduce pressure, washed with 30 mL of hexane and dried at high vacuum pressure pump. Yield: 1.3 g, 78.5%. Mp: 223° C. $^1$H NMR (400 MHz, DMSO-$d_6$): δ 1.55 (s, 6H) 3.35 (s, 3H) 5.51 (s, 1H) 7.02 (t, J=7.38 Hz, 1H) 7.12 (d, J=7.75 Hz, 1H) 7.26 (t, J=7.44 Hz, 1H) 7.39 (d, J=7.25 Hz, 1H); $^{13}$C NMR (101 MHz, DMSO-$d_6$): δ 26.66, 29.68, 46.90, 81.59, 108.55, 121.82, 121.91, 127.71, 140.14, 143.18, 166.86, 173.76, 190.20, 191.80.

2. 3-((3-decyl-1,3-didodecylindolin-2-ylidene) methyl)-4-hydroxycyclobut-3-ene-1,2-dione (2b)

3-Butoxy-4-((3-decyl-1,3-didodecylindolin-2-ylidene) methyl)cyclobut-3-ene-1,2-dione 1b (2 g, 2.63 mmol) were dissolved in 30 mL of acetone in a single neck round bottom flask followed by the addition of 4 N aqueous HCl (6 mL), resultant mixture were refluxed for 24 h. Solvents were removed under reduce pressure, and reaction mixture were purified by column chromatography ($SiO_2$, 100-200 mesh, 3-5% MeOH and 97-95% $CH_2Cl_2$) to afford the required compound as semi-solid. Yield: 1.1 g, 59.5%. $^1$H NMR (400 MHz, $CDCl_3$): δ 0.48 (br. s., 2H) 0.81-0.87 (m, 11H) 1.03 (br. s., 10H) 1.13-1.25 (m, 38H) 1.37 (br. s., 2H) 1.68-1.78 (m, 2H) 1.83-1.95 (m, 2H) 2.70 (t, J=10.76 Hz, 2H) 3.84 (br. s., 2H) 5.78 (br. s., 1H) 6.81 (d, J=7.79 Hz, 1H) 7.03 (t, J=7.33 Hz, 1H) 7.18-7.26 (m, 2H); $^{13}$C NMR (101 MHz, $CDCl_3$): δ 14.18, 22.77, 24.20, 27.42, 29.40, 29.45, 29.57, 29.73, 32.00, 40.10, 43.01, 57.15, 83.90, 107.76, 122.12, 127.41, 137.85, 145.00, 164.94, 167.42, 175.61, 178.20, 191.38.

[C] Synthesis of Unsymmetrical Squaraine

General Synthetic Procedure of AK Dyes

The compound 2 (1 equiv.) and 4-aminobenzoic acid or a substituted 4-aminobenzoic acid (1 equiv.) were dissolved in anhydrous PhMe and n-BuOH (1:1, 10 mL of each) in a round bottom flask and refluxed in the Dean-Stark apparatus for 24 h under an inert atmosphere. The reaction mixture was purified by column chromatography ($SiO_2$, 100-200 mesh, MeOH and $CH_2Cl_2$) to afford the required dye.

Example 5: 4-((4-carboxyphenyl)iminio)-3-oxo-2-((-1,3,3-trimethylindolin-2-ylidene) methyl) cyclobut-1-en-1-olate (3, AK1)

Compound AK1 was prepared by using compound 2a (0.5 g, 1.858 mmol) and 4-aminobenzoic acid (0.255 g, 1.858 mmol). The red colour solid was filtered and dried at high vacuum pressure pump. Yield: 0.5 g, 69.3%. Mp: more than 300° C. $^1$H NMR (400 MHz, DMSO-$d_6$): δ 1.68 (s, 6H) 3.59 (s, 3H) 5.77 (s, 1H) 7.19 (m, 1H) 7.33-7.45 (m, 2H) 7.54 (d, J=7.63 Hz, 1H) 7.83-8.06 (m, 4H); $^{13}$C NMR (101 MHz, DMSO-$d_6$): δ 26.53, 30.73, 48.83, 85.96, 110.57, 119.31, 122.23, 124.01, 125.85, 128.01, 130.72, 141.34, 142.13, 142.66, 166.88, 171.47, 175.62, 181.82; IR ($cm^{-1}$): 2977, 2890, 1741, 1657, 1591, 1535, 1462, 1385, 1298, 1258, 1233, 1154, 1073, 958; HRMS (m/z): $[M-H]^+$ calculated for $C_{23}H_{19}O_4N_2$: 387.1339; found: 387.1350.

Example 6: 4-((4-carboxyphenyl)(methyl)iminio)-3-oxo-2-((-1,3,3-trimethylindolin-2-ylidene)methyl) cyclobut-1-en-1-olate (4, AK2)

Compound AK2 was prepared by using compound 2a (0.2 g, 0.743 mmol) and 4-(methylamino)benzoic acid (0.112 g, 0.743 mmol), and was purified by column chromatography ($SiO_2$, 100-200 mesh, 5% MeOH and 95% $CH_2Cl_2$). Yield: 0.180 g, 60.2%. Mp: 297° C. $^1$H NMR (400 MHz, DMSO-$d_6$): δ 1.64 (s, 6H) 3.54 (s, 3H) 3.94 (s, 3H) 5.70 (s, 1H) 7.12-7.19 (m, 1H) 7.30-7.38 (m, 2H) 7.51 (d, J=7.63 Hz, 1H) 7.55-7.62 (m, 2H) 7.91-8.02 (m, 2H); 13C NMR (101 MHz, DMSO-$d_6$): δ 26.91, 29.38, 29.73, 46.97, 48.77, 81.89, 108.51, 110.71, 116.88, 121.90, 121.97, 127.88, 131.31, 140.26, 143.44, 153.58, 166.26, 167.79, 174.51, 192.40; IR ($cm^{-1}$): 2980, 2889, 1745, 1680, 1592, 1565, 1503, 1473, 1461, 1454, 1383, 1348, 1262, 1240, 1184, 1151, 1074, 1055, 1012, 966, 954; HRMS (m/z): $[M-H]^+$ calculated for $C_{24}H_{21}O_4N_2$: 401.1496; found: 401.1508.

Example 7: 4-((4-carboxyphenyl)iminio)-2-(((S)-3-decyl-1,3-didodecylindolin-2-ylidene)methyl)-3-oxocyclobut-1-en-1-olate (5, AK3)

Compound AK3 was prepared by using compound 2b (0.3 g, 0.426 mmol) and 4-aminobenzoic acid (0.058 g, 0.426 mmol), and was purified by column chromatography ($SiO_2$, 100-200 mesh, 2.5% MeOH and 97.5% $CH_2Cl_2$). Yield:

0.21 g, 60%. Mp: 108° C. $^1$H NMR (400 MHz, $CDCl_3$): δ 0.52 (br. s., 2H) 0.82 (m, 8H) 0.88 (t, J=6.87 Hz, 3H) 1.09-1.15 (m, 30H) 1.23-1.32 (m, 16H) 1.37 (br. s., 2H) 1.44 (m, 2H) 1.75-1.89 (m, 2H) 1.97-2.15 (m, 2H) 2.96 (br. s., 2H) 4.03 (br. s., 2H) 6.05 (br. s., 1H) 7.03 (d, J=7.63 Hz, 1H) 7.19-7.25 (m, 1H) 7.29-7.42 (m, 2H) 8.11-8.39 (m, 4H); $^{13}$C NMR (101 MHz, $CDCl_3$): δ 14.05, 14.08, 22.61, 22.63, 22.67, 23.89, 27.22, 29.17, 29.28, 29.30, 29.33, 29.40, 29.52, 29.57, 29.61, 31.84, 31.87, 40.02, 43.87, 58.93, 86.79, 109.44, 119.48, 122.36, 124.27, 125.64, 127.81, 132.00, 138.94, 142.74, 143.92, 170.32, 170.54, 172.67, 178.30; IR ($cm^{-1}$): 2955, 2921, 2852, 1765, 1665, 1639, 1595, 1532, 1480, 1466, 1415, 1357, 1300, 1273, 1247, 1182, 1154, 1104, 1084, 1021, 965, 955; HRMS (m/z): $[M-H]^+$ calculated for $C_{54}H_{81}O_4N_2$: 821.6191; found: 821.6194.

Example 8: 4-((4-carboxyphenyl)(methyl)iminio)-2-(((S)-3-decyl-1,3-didodecylindolin-2-ylidene)methyl)-3-oxocyclobut-1-en-1-olate (6, AK4)

Compound AK4 was prepared by using compound 2b (0.2 g, 0.284 mmol) and 4-(methylamino)benzoic acid (0.043 g, 0.284 mmol), and was purified by column chromatography ($SiO_2$, 100-200 mesh, 3% MeOH and 97% $CH_2Cl_2$). Yield: 0.130 g, 54.7%. Mp: 110° C. $^1$H NMR (400 MHz, $CDCl_3$): δ 0.47 (br. s., 2H) 0.74 (br. s., 2H) 0.86 (m, 9H) 1.07-1.22 (m, 30H) 1.25 (s, 16H) 1.31-1.36 (m, 2H) 1.38-1.46 (m, 2H) 1.77 (m, 2H) 1.90-2.03 (m, 2H) 2.92 (m, 2H) 3.94-4.06 (m, 5H) 6.03 (br. s., 1H) 7.00 (d, J=7.63 Hz, 1H) 7.14-7.22 (m, 1H) 7.28-7.36 (m, 2H) 7.45 (d, J=8.39 Hz, 2H) 8.08 (d, J=8.39 Hz, 2H); $^{13}$C NMR (101 MHz, $CDCl_3$): δ 14.06, 22.59, 22.63, 23.97, 27.16, 29.24, 29.28, 29.39, 29.42, 29.47, 29.53, 29.59, 29.64, 31.83, 31.86, 38.03, 40.05, 43.74, 58.73, 86.69, 109.28, 111.03, 117.09, 121.51, 122.25, 123.96, 127.69, 131.04, 132.25, 138.78, 144.01, 144.65, 153.47, 169.12, 169.95, 171.82, 174.60, 181.65; IR ($cm^{-1}$): 2954, 2921, 2852, 1758, 1705, 1688, 1601, 1562, 1492, 1479, 1443, 1398, 1354, 1296, 1254, 1176, 1148, 1103, 1049, 1015, 965, 955; HRMS (m/z): $[M-H]^+$ calculated for $C_{55}H_{83}O_4N_2$: 835.6347; found: 835.6349.

Example 9: 4-((4-carboxyphenyl)(hexyl)iminio)-2-(3-decyl-1,3-didodecylindolin-2-ylidene)methyl)-3-oxocyclobut-1-en-1-olate (AM1)

Compound AM1 was prepared by using compound 2b (0.2 g, 0.284 mmol) and 4-(hexylamino)benzoic acid (0.062 g, 0.284 mmol). The red colour solid was filtered and dried at high vacuum pressure pump. Yield: 120 mg, 46%. Mp: 128° C. $^1$H NMR (400 MHz, $CDCl_3$): δ 0.45 (d, J=6.41 Hz, 2H) 0.63-0.79 (m, 4H) 0.81-0.86 (m, 12H) 1.05 (br. s., 12H) 1.20-1.28 (m, 27H) 1.32-1.43 (m, 6H) 1.60-1.80 (m, 4H) 1.85-2.04 (m, 2H) 2.77-2.99 (m, 2H) 3.57-3.76 (m, 6H) 3.84 (t, J=4.81 Hz, 1H) 3.94 (br. s., 2H) 4.05-4.14 (m, 1H) 4.45 (t, J=6.87 Hz, 2H) 5.96 (s, 1H) 6.76-6.87 (m, 1H) 6.94 (d, J=7.78 Hz, 1H) 7.10-7.16 (m, 1H) 7.27-7.32 (m, 1H) 7.35 (d, J=8.70 Hz, 2H) 8.04 (d, J=8.24 Hz, 2H); $^{13}$C NMR (101 MHz, $CDCl_3$): δ 14.06, 14.21, 22.58, 22.75, 22.77, 24.09, 25.99, 27.22, 27.31, 29.05, 29.40, 29.43, 29.53, 29.61, 29.68, 29.73, 31.45, 31.97, 31.99, 40.22, 43.70, 58.59, 61.74, 69.89, 70.32, 70.63, 70.83, 72.64, 86.43, 109.13, 113.83, 113.91, 122.33, 123.50, 123.76, 127.08, 127.74, 131.23, 138.75, 142.85, 144.24, 169.24, 175.34; IR ($cm^{-1}$): 2954, 2919, 2851, 1750, 1704, 1589, 1562, 1488, 1469, 1433, 1410, 1354, 1310, 1269, 1243, 1208, 1187, 1176, 1130, 1104, 1078, 1014, 963, 939.

Example 10: 4-((4-carboxyphenyl)(2-ethylhexyl)iminio)-2-(3-decyl-1,3-didodecylindolin-2-ylidene)methyl)-3-oxocyclobut-1-en-1-olate (AM2)

Compound AM2 was prepared by using compound 2b (0.2 g, 0.277 mmol) and 4-((2-ethyhexyl)amino)benzoic acid (0.069 g, 0.277 mmol), and purified by column chromatography ($SiO_2$, 100-200 mesh, 2.5% MeOH and 97.5% $CH_2Cl_2$). Yield: 0.110 g, 42%, Mp: 108° C. $^1$H NMR (400 MHz, $CDCl_3$): δ 0.45 (d, J=6.41 Hz, 2H) 0.60-0.78 (m, 5H) 0.82-0.87 (m, 16H) 1.05 (br. s., 12H) 1.19-1.25 (m, 26H) 1.35-1.41 (m, 5H) 1.74 (d, J=6.41 Hz, 2H) 1.93 (t, J=12.14 Hz, 2H) 2.87 (t, J=11.22 Hz, 2H) 3.57-3.68 (m, 7H) 3.68-3.75 (m, 2H) 3.83 (t, J=4.81 Hz, 1H) 3.93 (t, J=6.87 Hz, 2H) 4.10 (t, J=4.81 Hz, 1H) 4.34-4.54 (m, 2H) 5.94 (s, 1H) 6.76-6.87 (m, 1H) 6.94 (d, J=7.79 Hz, 1H) 7.08-7.16 (m, 2H) 7.27-7.32 (m, 1H) 7.32-7.37 (m, 2H) 8.02 (m, J=8.24 Hz, 2H); $^{13}$C NMR (101 MHz, $CDCl_3$): δ 1.10, 10.64, 14.09, 14.21, 14.57, 22.77, 23.02, 23.40, 24.11, 24.76, 27.19, 27.32, 28.47, 29.43, 29.53, 29.63, 29.72, 30.00, 30.84, 31.99, 37.35, 40.32, 41.52, 43.65, 58.50, 61.77, 67.26, 69.90, 70.37, 70.63, 70.69, 70.85, 72.55, 86.27, 109.04, 113.72, 113.82, 113.90, 122.30, 123.65, 123.87, 127.00, 127.08, 127.46, 127.70, 129.29, 131.19, 138.71, 142.31, 144.29, 168.94, 175.94, 180.59; IR ($cm^{-1}$): 2956, 2921, 2852, 1752, 1705, 1589, 1563, 1470, 1433, 1412, 1378, 1352, 1309, 1273, 1260, 1217, 1203, 1176, 1134, 1118, 1102, 1064, 1015, 965, 938.

Example 11: 4-((4-carboxyphenyl)(phenyl)iminio)-2-(-3-decyl-1,3-didodecylindolin-2-ylidene)methyl)-3-oxocyclobut-1-en-1-olate (AM3)

Compound AM3 was prepared by using compound 2b (0.25 g, 0.347 mmol) and 4-(phenylamino)benzoic acid (0.074 g, 0.347 mmol), and was purified by column chromatography ($SiO_2$, 100-200 mesh, 2.5% MeOH and 97.5% $CH_2Cl_2$). Yield: 0.12 g, 38%, Mp: 108° C. $^1$H NMR (400 MHz, $CDCl_3$): δ 0.40-0.53 (m, 2H) 0.75 (br. s., 2H) 0.87-0.92 (m, 9H) 1.10 (d, J=9.92 Hz, 12H) 1.20-1.24 (m, 10H) 1.25-1.32 (m, 24H) 1.34-1.48 (m, 5H) 1.76-1.89 (m, 2H) 1.97 (td, J=13.07, 4.01 Hz, 2H) 2.97 (br. s., 2H) 4.06 (br. s., 2H) 6.16 (br. s., 1H) 7.07 (d, J=8.01 Hz, 1H) 7.22-7.26 (m, 3H) 7.29 (d, J=3.43 Hz, 2H) 7.30-7.34 (m, 1H) 7.37 (t, J=7.44 Hz, 2H) 7.42-7.49 (m, 2H) 8.05 (d, J=8.39 Hz, 2H); $^{13}$C NMR (101 MHz, $CDCl_3$): δ 14.12, 22.69, 24.05, 27.23, 27.41, 29.34, 29.42, 29.63, 31.92, 40.06, 44.11, 59.33, 87.88, 109.79, 120.74, 122.39, 124.58, 125.61, 127.62, 127.86, 128.55, 129.05, 129.52, 131.15, 132.23, 139.18, 140.27, 144.50, 168.17, 171.48, 186.39; IR ($cm^{-1}$): 2953, 2922, 2852, 1760, 1706, 1605, 1559, 1488, 1465, 1425, 1406, 1352, 1294, 1235, 1207, 1172, 1138, 1104, 1185, 1016, 1004, 960, 920.

[D] Procedure for Dye-Sensitized Solar Cell Fabrication.

Example 12

Fluorine-doped $SnO_2$ glass (8-10 Ω/sq; Pilkington TEC 7) was washed with mucasol (2% in water), de-ionized water, and isopropanol by using ultrasonic-bath to make cleaned. To grow a thin film $TiO_2$, FTO was treated with 40 mM aqueous $TiCl_4$ solution at 70° C. for 30 min, washed with the de-ionized water then EtOH, and dried at 110° C. for 10 min A paste of $TiO_2$ nanocrystal (<20 nm, Ti-Nanoxide T/SP, Solaronix) was coated on FTO conducting side by using doctor-blade technique and kept for 15 min in the air then heated at 120° C. in the air for 20 min, then coated with scattering layer $TiO_2$ paste (WER2-O, Dyesol) and heated at 120° C. for 10 min in the air, then sintered at 325° C. for 10 min, 375° C. for 10 min, 450° C. for 10 min and 500° C. for 15 min where the heating rate was 5° C. per min in the air. After sintering, films were treated with 40 mM aqueous $TiCl_4$ solution at 70° C. for 30 min, washed with the de-ionized water then EtOH and sintered at 500° C. for 20 min. Then immersed the cells (area of $TiO_2$ is 0.23 $cm^2$) in 0.1 mM or 0.2 mM dye solution of AK or AK:SQ (0.1 mM each) for 12 h. Electroplatinised platinum foil used as a cathode, iodolyte Z-50 (Solaronix) was used as electrolyte and 25 μm spacer and area is 0.23 $cm^2$. The device performance of AK and co-sensitized dyes were measured under standard simulator condition (AM 1.5 G, 100 $mW/cm^2$).

[E] I-V, IPCE Performance of AK and AK:SQ (1:1) Dyes

Example 13

The IPCE response from monomeric dyes, the photoanode coated with $TiO_2$ (Thickness of $TiO_2$ 8+4 μm, area 0.23 $cm^2$) was first saturated with coadsorbent CDCA for 12 h (1.0 mM in MeCN) and further dipped in dye solution for 2 min (0.1 or 0.2 mM in MeCN). Iodolyte Z-50 (Solaronix).

ADVANTAGES OF THE PRESENT INVENTION

- Good DSSC device performance with good incident photon to current conversion efficiency (IPCE) in the visible region of the solar spectrum
- The present set of dyes may be used as a complementary dye for panchromatic light absorption by mixing them with NIR and Far-red active dyes
- The present set of dyes may be compatible with cobalt, copper and other redox electrolytes for better open-circuit potential.
- The side chain of the dyes can be modified to alkyl, alkoxy groups for aqueous electrolyte based dye-sensitized solar cells

We claim:

1. An unsymmetrical squaraine dye of formula (I):

Formula (I)

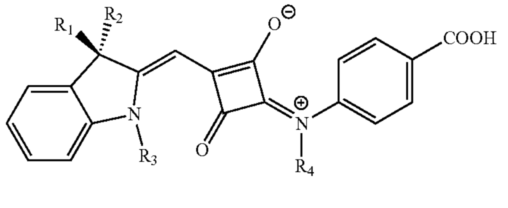

wherein each of $R_1$ to $R_3$, independently, is selected from the group consisting of hydrogen, straight or branched chain C1 to C20 alkyl, C1 to C20 alkoxy, aryl, arylalkyl, fused aryl polyethylene glycol units, C1 to C10 perfluoroalkyl chains, halides, cyano; and trifluoromethyl; and R4 is hydrogen, C1 to C20 alkyl, or phenyl.

2. The dye of claim 1, wherein each of $R_1$-$R_4$, independently, is H or straight or branched chain C1 to C20 alkyl.

3. The dye of claim 2, wherein $R_3$ is $CH_3$ or $C_{12}H_{25}$.

4. The dye of claim 3, wherein $R_4$ is H, $CH_3$, hexyl, 2-ethylhexyl, or phenyl.

5. The dye of claim 4, wherein each of $R_1$ and $R_2$, independently, is $CH_3$, $C_{10}H_{21}$, or $C_{12}H_{25}$.

6. The dye of claim 1, wherein the squaraine dye is selected from the group consisting of:

4-((4-carboxyphenyl)iminio)-3-oxo-2-((-1,3,3-trimethylindolin-2-ylidene)methyl)cyclobut-1-en-1-olate (3, AK1), 4-((4-carboxyphenyl)(methyl)iminio)-3-oxo-2-((-1,3,3-trimethylindolin-2-ylidene)methyl)cyclobut-1-en-1-olate (4, AK2), 4-((4-carboxyphenyl)iminio)-2-(((S)-3-decyl-1,3-didodecylindolin-2-ylidene)methyl)-3-oxocyclobut-1-en-1-olate (5, AK3), 4-((4-carboxyphenyl)(methyl)iminio)-2-(((S)-3-decyl-1,3-didodecylindolin-2-ylidene)methyl)-3-oxocyclobut-1-en-1-olate (6, AK4), 4-((4-carboxyphenyl)(hexyl)iminio)-2-(3-decyl-1,3-didodecylindolin-2-ylidene)methyl)-3-oxocyclobut-1-en-1-olate (AM1), 4-((4-carboxyphenyl)(2-ethylhexyl)iminio)-2-(3-decyl-1,3-didodecylindolin-2-ylidene)methyl)-3-oxocyclobut-1-en-1-olate (AM2), and 4-((4-carboxyphenyl)(phenyl)iminio)-2-(-3-decyl-1,3-didodecylindolin-2-ylidene)methyl)-3-oxocyclobut-1-en-1-olate (AM3).

7. The dye of claim 1, wherein the dye shows absorption in the range of 529-541 nm with extinction coefficient ranging between 1.44-1.85×$10^5$ $M^{-1}$ $cm^{-1}$.

8. A process of preparing the dye of claim 1, comprising the steps of:

a) refluxing a reaction mixture of 3-cycloalkene-1,2-dione compound dissolved in a solvent and aqueous HCl at room temperature and heated in the range of 80 to 100° C. for a period in the range of 22 to 24 h to afford a corresponding semisquaraine compound; and b) refluxing the semisquaraine compound of step (a) and phenyl carboxylic acid dissolved in the solvent at room temperature and refluxed in the range of 130 to 140° C. for a period in the range of 10 to 12 h to afford the corresponding unsymmetrical squaraine dye.

9. The process of claim 8, wherein the 3-cycloalkene-1,2-dione compound is 3-butoxy-4-((1,3,3-trimethylindolin-2-ylidene)methyl)cyclobut-3-ene-1,2-dione or 3-butoxy-4-((3-decyl-1,3-didodecylindolin-2-ylidene)methyl)cyclobut-3-ene-1,2-dione.

10. The process of claim 8, wherein the semisquaraine compound is 3-hydroxy-4-((1,3,3-trimethylindolin-2-ylidene)methyl)cyclobut-3-ene-1,2-dione or 3-((3-decyl-1,3-didodecylindolin-2-ylidene)methyl)-4-hydroxycyclobut-3-ene-1,2-dione and the phenyl carboxylic acid is 4-Aminobenzoic acid, 4-(methylamino)benzoic acid, 4-(hexylamino)benzoic acid, 4-((2-ethylhexyl)amino)benzoic acid, or 4-(phenylamino)benzoic acid.

11. The process of claim 8, wherein the solvent in step (a) and (b) is acetone, 1-butanol, toluene, or a mixture thereof and the process is carried out under nitrogen atmosphere.

12. An electronic device comprising the dye of claim 1.

13. The electronic device of claim 12, wherein the dye is co-sensitized with a squaraine dye of SQ1 (5-carboxy-2-[[3-[(1,3-dihydro-1,3,3-trimethyl-2H-indol-2-ylidene)methyl]-2-hydroxy-4-oxo-2-cyclobuten-1-ylidene]methyl]-1,3,3-trimethyl-3H-indolium) or a squaraine dye of SQS4 in a 1:1 ratio and device has a device efficiency of 9.36%, wherein SQS4 is represented by

SQ1

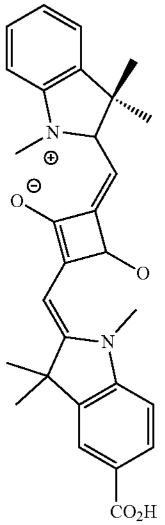

SQS4

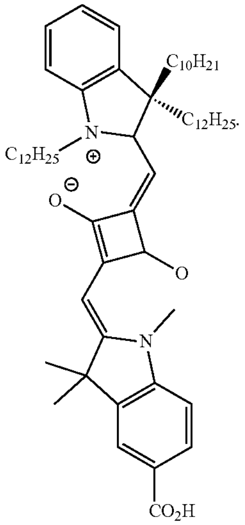

14. A dye-sensitized solar cell comprising the dye of claim 1.

15. The solar cell of claim 14, wherein the dye is co-sensitized with a squaraine dye of SQ1 (5-carboxy-2-[[3-[(1,3-dihydro-1,3,3-trimethyl-2H-indol-2-ylidene)methyl]-2-hydroxy-4-oxo-2-cyclobuten-1-ylidene]methyl]-1,3,3-trimethyl-3H-indolium) or a squaraine dye of SQS4 in a 1:1 ratio and device has a conversion efficiency of 9.36%, wherein SQS4 is represented by

SQ1

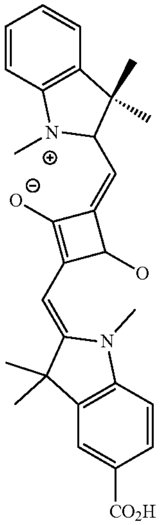

SQS4

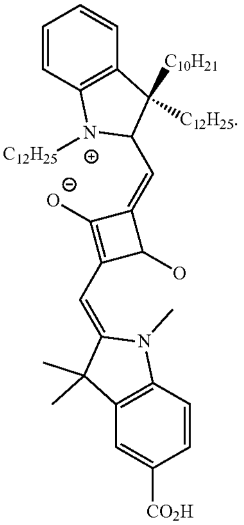

* * * * *